United States Patent
Quirk et al.

(10) Patent No.: US 9,054,488 B2
(45) Date of Patent: Jun. 9, 2015

(54) SPECKLE REDUCTION FOR LASER PROJECTION DISPLAYS

(75) Inventors: John Quirk, Portland, OR (US); Craig Lyon, West Jordan, UT (US)

(73) Assignee: Maxim Integrated Products, Inc., San Jose, CA (US)

(*) Notice: Subject to any disclaimer, the term of this patent is extended or adjusted under 35 U.S.C. 154(b) by 130 days.

(21) Appl. No.: 13/286,504

(22) Filed: Nov. 1, 2011

(65) Prior Publication Data

US 2012/0140784 A1 Jun. 7, 2012

Related U.S. Application Data

(60) Provisional application No. 61/420,212, filed on Dec. 6, 2010.

(51) Int. Cl.
| | | |
|---|---|---|
| *H01S 3/00* | (2006.01) | |
| *H01S 5/042* | (2006.01) | |
| *G02B 27/48* | (2006.01) | |
| *H04N 9/31* | (2006.01) | |
| *H01S 5/062* | (2006.01) | |

(52) U.S. Cl.
CPC .............. *H01S 5/0428* (2013.01); *G02B 27/48* (2013.01); *H04N 9/3129* (2013.01); *H01S 5/06216* (2013.01)

(58) Field of Classification Search
USPC ............................. 372/29.015, 38.02, 38.07
See application file for complete search history.

(56) References Cited

U.S. PATENT DOCUMENTS

| 6,396,858 B2* | 5/2002 | Kawakami et al. | ........ 372/38.02 |
|---|---|---|---|
| 2001/0046242 A1* | 11/2001 | Kawakami et al. | ........ 372/38.02 |
| 2003/0035451 A1* | 2/2003 | Ishida et al. | ............... 372/38.02 |
| 2006/0165142 A1* | 7/2006 | Robinson et al. | .......... 372/38.07 |
| 2007/0274355 A1* | 11/2007 | Hattori | ........................ 372/38.02 |
| 2009/0129416 A1* | 5/2009 | Moriyama | .................. 372/38.02 |
| 2010/0150190 A1* | 6/2010 | Masood et al. | .......... 372/29.023 |

* cited by examiner

*Primary Examiner* — Yuanda Zhang
(74) *Attorney, Agent, or Firm* — North Weber & Baugh LLP

(57) ABSTRACT

Various embodiments of the present invention relate to a laser driver, and more particularly, to systems, devices and methods of applying low current pulses to a laser modulation current to reduce the speckling noise on the projected images.

17 Claims, 6 Drawing Sheets

SPECKLE REDUCTION FOR LASER PROJECTION DISPLAYS

CROSS REFERENCE TO RELATED PATENT APPLICATIONS

This application claims priority to U.S. Provisional Application Ser. No. 61/420,212, entitled "Speckle Reduction for Laser Projection Displays," filed Dec. 6, 2010, which application is incorporated herein by reference in its entirety.

BACKGROUND

A. Technical Field

The present invention relates to the field of laser illumination systems, and more particularly, to systems, devices and methods of employing pulsed drive currents to drive the lasers and reduce the speckling noises on the projected images.

B. Background of the Invention

Laser light sources used for projection display have shown advantages compared with the conventional light sources, such as ultra-high pressure (UHP) lamps, high-intensity discharge (HID) lamp and xenon lamps. The laser light sources provide wide color expression with narrow spectrum. The color gamut of a light source based on red, green and blue (RGB) lasers can be easily expanded beyond that of NTSC (e.g. 166%), while the color gamut of a lamp projector is less than that of NTSC. Moreover, the laser light sources have longer lifetime, need shorter response time, require no warm-up time, generate less noise, consume less power, and result in higher contrast ratio. In particular, the laser light sources made from semiconductor diodes are desirable for projection displays due to compactness and efficiency. However, to realize a laser illumination system, laser speckling is an issue that needs to be addressed.

Laser speckles arises when the coherent laser light is scattered from a rough display surface and passes the audience's eyes, an optical system having a finite aperture, to form an image. Slight different phases are introduced to the coherent light scattered from different spots on the rough surface. The optical interference of the light shows up as speckles in the image received by the audience. The size of the speckles is related to many factors, such as the light wavelength, the laser beam size, and the distance between the audience and the display surface. Laser speckles are usually quantified by the speckle contrast. Existence of the speckles degrades the image quality, and as one type of noises, the laser speckles should be reduced to a minimum level.

Reduction of speckling noise is equivalent to reduce the contrast of the speckling pattern. More independent speckle patterns need to be introduced and superimposed to average out on the retina/light receiver. Multiple approaches have been taken to achieve this purpose. In the near field of laser sources, the reduction of laser speckle is implemented by using lasers of different wavelengths, a moving diffuser, a moving aperture or aperture averaging. In the far field of laser sources, the reduction of laser speckle is implemented by using vibrating screen, a fiber or fiber bundles with difference lengths, refractive indices, diffractive optical elements or a rotating polygon mirror with two dimensional scanning. However, all these methods involve adding more components to the optical system, and can increase the complexity, size and cost of the display system dramatically.

The laser light sources desirable for projection displays are based on three semiconductor diodes that generate blue, red and green lasers, respectively. FIG. 1 is a block diagram for a typical laser-based projection display. The RGB lasers 102, 104 and 106 are driven by laser drivers 108, and the generated lights are guided by a beam combiner 110 to a scanner 112 which projects an image to a surface 114. The laser drivers 108 and the scanner 112 are both under control of synchronous video data. Light emission power of the lasers 102, 104 and 106 is correlated with the laser current $I_{LASER}$ injected to the diode as in FIG. 2. $I_{TH}$ is a laser threshold current. If the laser current is below $I_{TH}$, the light emission power is too small to trigger visible light, and the laser current is represented as a biasing current $I_{BIAS}$. If the laser current is above $I_{TH}$, the light emission power is roughly linearly proportional to the diode current $I_{LASER}$, which is represented as a modulation current $I_{MOD}$. In real time, the modulation current $I_{MOD}$ is required to reach a level of $I_{OP}$ to generate a desirable emission power $P_{OP}$. The modulation current $I_{MOD}$ varies with time to deliver different light emission power $P_{OP}$ and thus different image brightness.

In addition to optical system adjustment, an alternative approach to reduce the speckling noise in a projection display is to use a sinusoid current to drive the laser. The laser illumination is terminated every time the laser current approaches a minimum value which is equal to or slightly below the threshold current $I_{TH}$. The laser wavelength varies slightly every time the laser light is switched back on, and the speckling noise may be improved. However, if the minimum value is above $I_{TH}$, speckle reduction is not significant, and if the minimum value is far below $I_{TH}$, the laser can be damaged due to regular powering on and off.

FIG. 3A illustrates a laser driver 300 with radio-frequency (RF) modulation to reduce speckles and FIG. 3B illustrates an exemplary current waveform 350. The laser driver 300 comprises three current sources 304, 306 and 308. The first current source 304 produces a modulation current $I_{MOD}$ above the threshold current $I_{TH}$ to deliver the desirable emission power $P_{OP}$. The second current source 306 produces an offset current $I_{BIAS}$ below the threshold current $I_{TH}$. The third current source 308 is particularly used to reduce the speckling noises by generating a high-frequency sinusoid laser current $I_{RF}$. The modulation and biasing currents $I_{MOD}$ and $I_{BIAS}$ defines an envelope specifying the peaks and valleys of the sinusoid laser current $I_{RF}$. The frequency of the modulation current $I_{MOD}$ is lower than that of the laser current $I_{RF}$. The magnitude of $I_{RF}$ is constantly adjusted according to $I_{MOD}$ in order to avoid levels far above and below $I_{TH}$. Due to the fixed equivalent duty cycle of 50%, the peak laser current (the modulation current) is twice of the target average current, and the emission power and the perceived image brightness are determined by the modulation current.

SUMMARY OF THE INVENTION

Various embodiments of the present invention relate to laser driving systems, devices and methods of applying low current pulses to a laser modulation current to reduce the speckling noise on the projected images Certain embodiments of the laser driver for speckle reduction comprise of a controller, a pulse-off control, two current sources and two series analog switches. The controller converts incoming video data to processed video data, which are used by the pulse-off control to generate analog controls switching the analog switches at specific instants. While one current source provides a modulation current for the laser to emit light, pulses of a low biasing current are introduced to break laser light to short pulses and reduce laser coherence. The speckling noise is averaged out by superimposing several patterns associated with short laser pulses within one sampling/integration period of human eyes. In addition to the modulation current, the duty cycle is involved as another variable to obtain the target average current. The system can therefore be simplified to various levels. In one embodiment, the modulation and biasing currents may be constant, and the target average current is determined only by the duty cycle.

Certain features and advantages of the present invention have been generally described in this summary section; however, additional features, advantages, and embodiments are presented herein or will be apparent to one of ordinary skill in the art in view of the drawings, specification, and claims hereof. Accordingly, it should be understood that the scope of the invention shall not be limited by the particular embodiments disclosed in this summary section.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

Embodiments of the present invention provide systems, devices and methods of employing pulsed drive currents to drive the lasers and reduce the speckling noise on the projected images in a laser-based projection display. In particular, short light-off pulses are introduced into the modulation current driving the laser instead of using RF modulation. In the following description, for purposes of explanation, specific details are set forth in order to provide an understanding of the invention. It will be apparent, however, to one skilled in the art that the invention can be practiced without these details. One skilled in the art will recognize that embodiments of the present invention, described below, may be performed in a variety of ways and using a variety of structures. Those skilled in the art will also recognize additional modifications, applications, and embodiments are within the scope thereof, as are additional fields in which the invention may provide utility. Accordingly, the embodiments described below are illustrative of specific embodiments of the invention and are meant to avoid obscuring the invention.

Reference in the specification to "one embodiment" or "an embodiment" means that a particular feature, structure, characteristic, or function described in connection with the embodiment is included in at least one embodiment of the invention. The appearance of the phrase "in one embodiment," "in an embodiment," or the like in various places in the specification are not necessarily all referring to the same embodiment.

In order to reduce the speckling noise, pulses at low biasing currents are applied to an original continuous modulation current that drives a laser. The laser illumination is temporarily terminated during the pulses. The modulation current, pulse biasing current, pulse frequency and pulse width are variables that may be adjusted to generate a target average current according to requirements of different applications.

Figure 1:
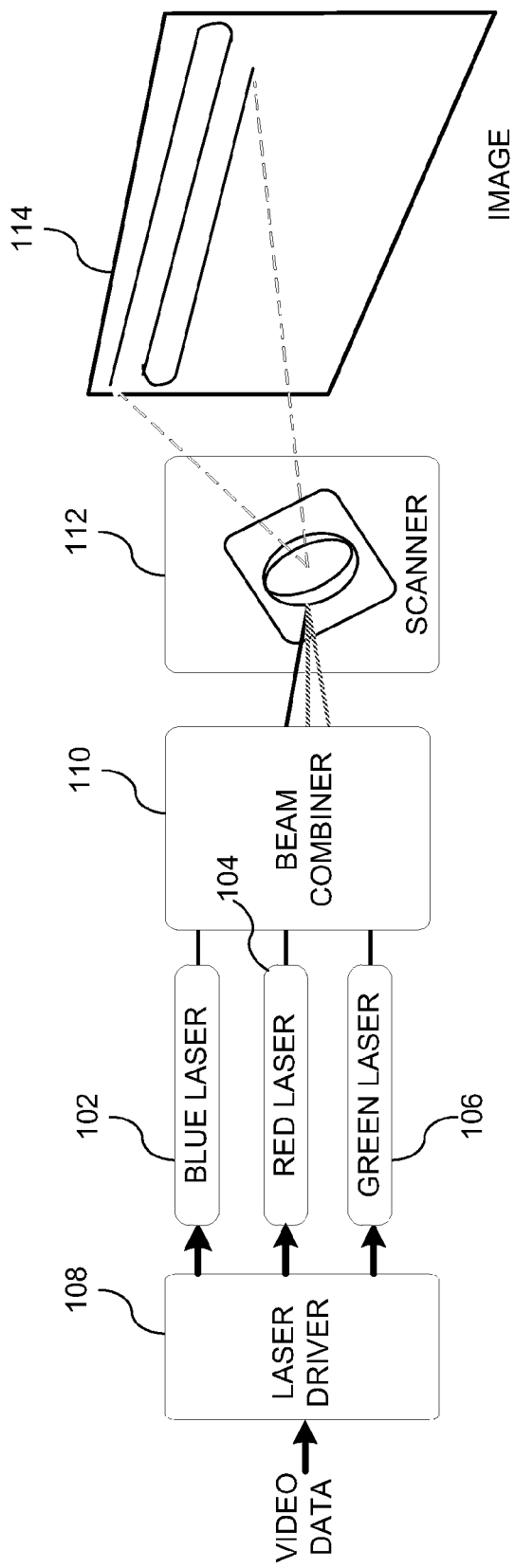
FIG. 1 illustrates a block diagram of a laser-based projection display.
Figure 2:
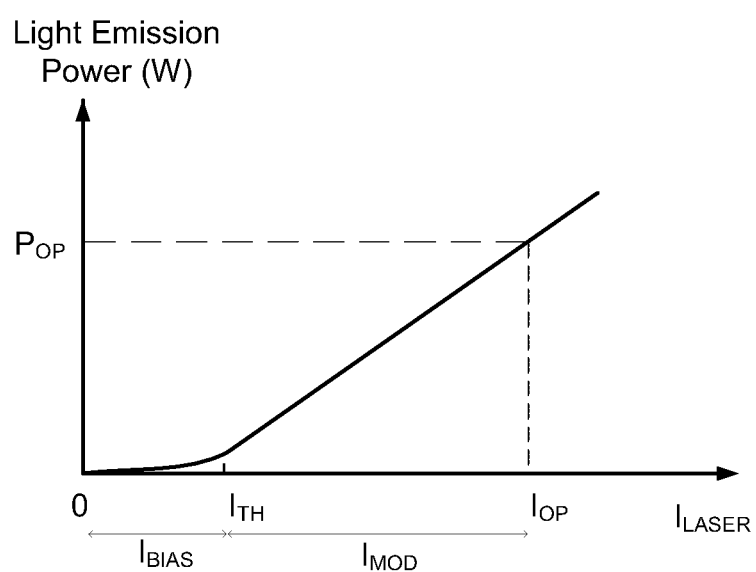
FIG. 2 illustrates a correlation of light emission power and laser diode current.
Figure 3A:
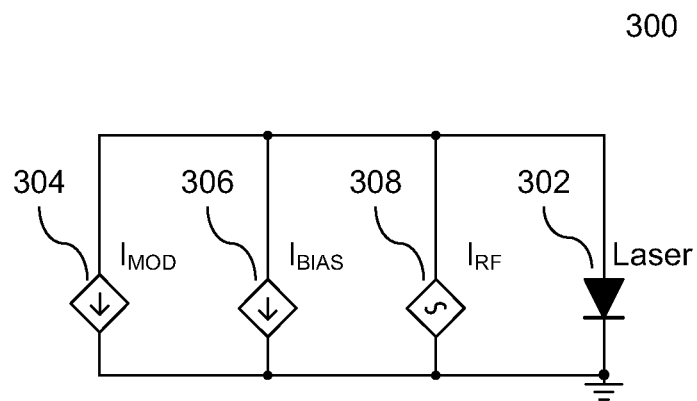
FIG. 3A illustrates a laser driver using RF modulation to reduce the speckling noises.
Figure 3B:
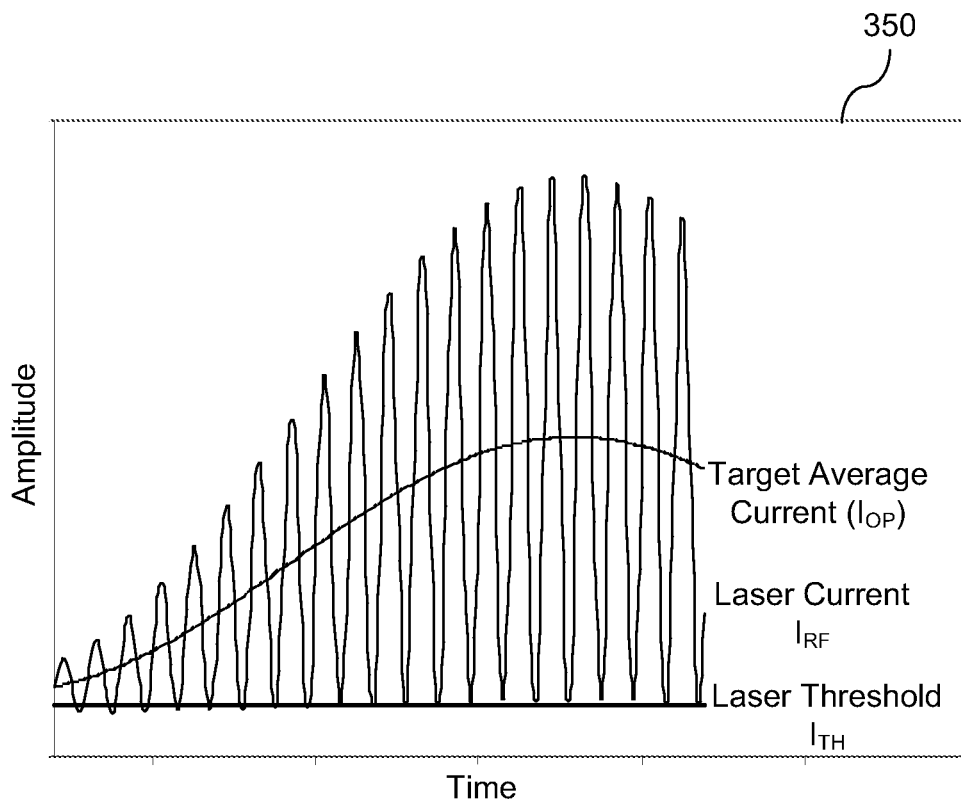
FIG. 3B illustrates a laser current waveform generated from RF modulation.
Figure 4:
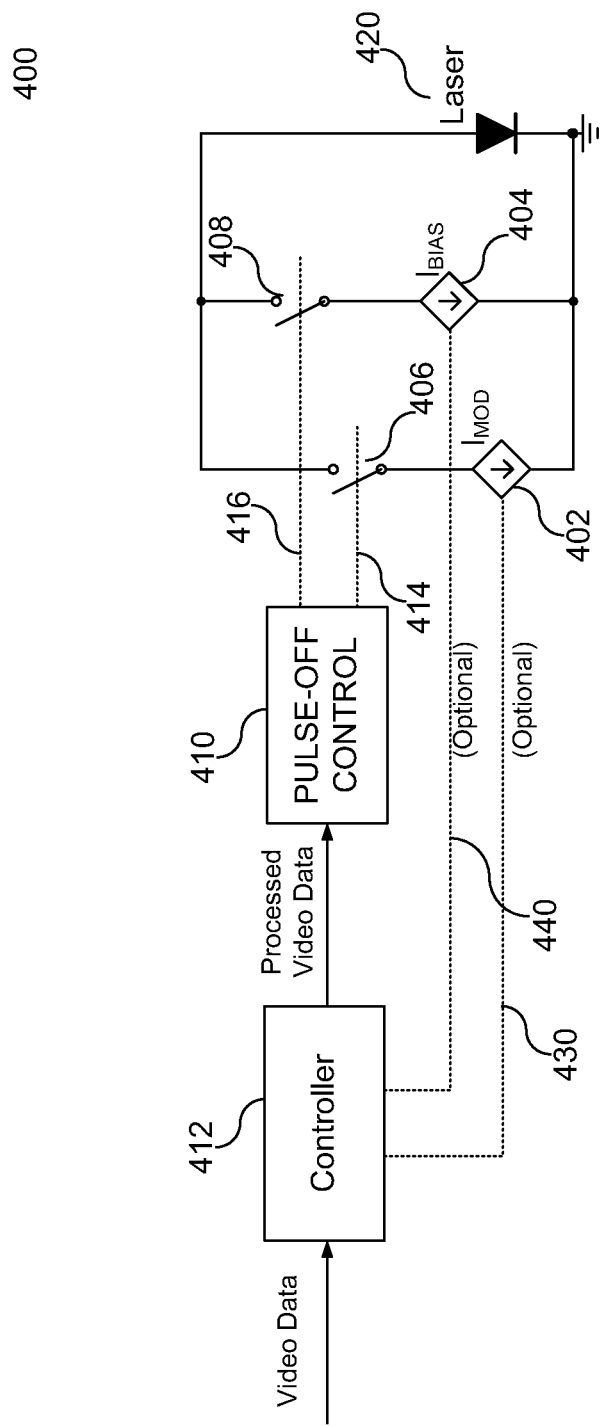
FIG. 4 illustrates a block diagram of a laser driver driving a laser diode with pulsed waveforms according to various embodiments of the invention.

FIG. 4 illustrates a block diagram 400 of a laser driver driving a laser diode with pulsed waveforms. The laser driver comprises a first current source 402, a second current source 404, a first analog switch 406, a second analog switch 408, a pulse-off control circuit 410 and a controller 412. The first current source 402 are in series with and under control of the first analog switch 406, and similarly, the second current source 404 are in series with and under control of the second analog switch 408. Once the first analog switch 406 is turned on, the first current source 402 is connected with the laser diode 420 and injects a modulation current $I_{MOD}$, and the laser diode emits light. Once the second analog switch 408 is turned on, the second current source 404 is connected with the laser diode 420 and injects a biasing current $I_{BIAS}$ which is equal to or less than $I_{TH}$, and the laser diode shuts off. In one embodiment, the first current source 402 is connected for most of the time to provide constant current drive for the laser diode 420 while the second current source 404 is connected to introduce low-current pulses to shut off the laser. In certain embodiment, both current levels of $I_{MOD}$ and $I_{BIAS}$ vary with time, and their temporal dependences are determined by input video data. Two analog switches 406 and 408 may be turned on simultaneously to allow both current sources 402 and 404 to be connected with the laser.

In one embodiment, the current sources 402 and 404 are implemented as digital-to-analog converters. The dynamic ranges of the converters are determined by the maximum modulation and biasing currents, respectively, and the resolutions of the converters are related to the resolution requirement of the perceived image brightness. A 12b resolution is commonly used. The controller 412 converts incoming video data to parallel or serial data 430 and 440 used to identify the current magnitudes for the current sources 402 and 404, respectively.

The pulse-off control circuit 410 controls the switching time and duration of the analog switches 406 and 408. Specific switching instants are identified by the controller 412 according to the frequency and the duty cycle of the light-off pulses. The controller 412 receives incoming video data and generates processed video data which are digital controls used to specify these switching instants. The pulse-off control circuit 410 further converts the processed video data to analog control voltages 414 and 416 to control the analog switches 406 and 408, respectively. In certain embodiment, conventional level shifters are used to generate the needed analog control voltages 414 and 416. The pulse-off control circuit 410 also needs to introduce tristate times on the pulse edges. The tristate times normally last for only a few nanoseconds during which both current sources are disconnected to avoid potential direct current if current sources are switched too closely.

The perceived image brightness and color are functions of the modulation current levels and duty cycles of all three RGB lasers while the pulse frequency and the biasing current level have no impact. The eyes sample information of images projected onto the retina in a periodic manner, and information is then integrated so objects appear to be stable or move smoothly. The color intensity perceived by an eye is the average color intensity over an eye's sampling/integration time which is typical 10-100 milliseconds. The light-off pulses are preferably generated more frequently than sampling/integration in eyes. These pulses break a coherent laser wave to several laser waves, and each lasts for a short duration while all the waves are integrated by eyes to generate one pattern in retina. These waves are incoherent to each other although each individual wave is highly coherent, and the wavelengths of these waves may vary slightly as well. Therefore, the speckles associated with each wave are shifted slightly and averaged upon integration. The speckling noises are largely reduced by these light-off pulses.

In order to generate a specific color at a specific brightness, the controller 412 first determines the intensity needed for each RGB laser, and then converts the intensity to the processed video data for the pulse-off control circuit 410 for each RGB laser. The resultant light emission power (intensity) is the function of the duty cycle and the instantaneous light emission power (intensity) within the sampling/integration time of eyes. A target average current $I_{OP}$ is related to the expected light emission power, and it should be determined by the duty cycle and the modulation current $I_{MOD}$.

Figure 5A:
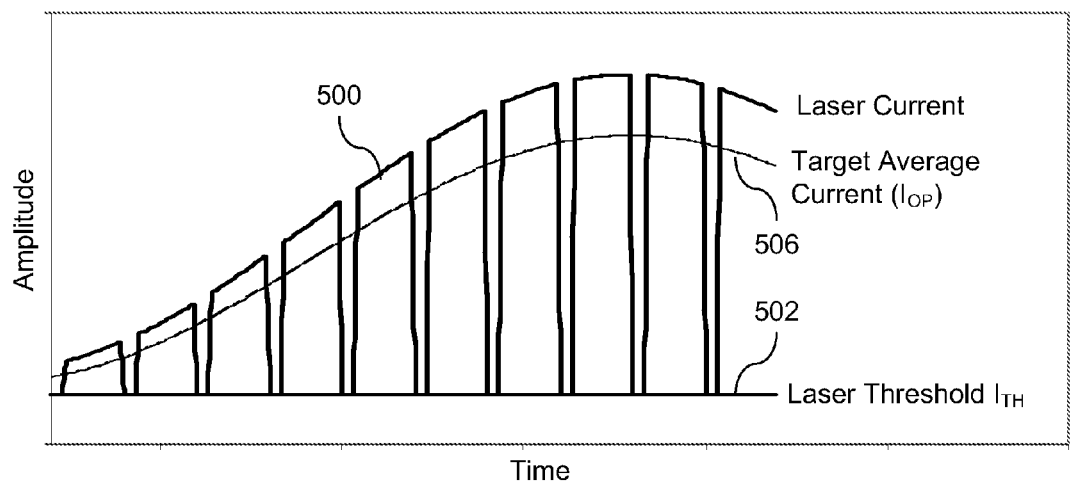
FIG. 5A illustrates an exemplary pulsed laser current waveform according to various embodiments of the invention.

FIG. 5A illustrates an exemplary pulsed laser current waveform 500 generated by certain embodiments of the pulse-off laser driver. The high-end modulation current $I_{MOD}$ varies with time, and during the pulse-off duration, the low-end biasing current $I_{BIAS}$ is controlled at a constant value equal to or slightly less than the laser threshold current $I_{TH}$ 502. The low-end biasing current $I_{BIAS}$ is sufficient to shut off light emission, while avoiding drive current to drop to zero and causing long-term degradation problems to laser reliability. In this embodiment, the current source 402 still relies on the video data to determine its temporal variation, and however, the current source 404 only needs to provide a constant biasing current $I_{-BIAS}$. In one embodiment, the current source 404 is permanently programmed to generate a fixed current level, and the circuit configuration may be largely simplified. In another embodiment, the current source 404 is capable of generating a variable biasing current $I_{BIAS}$, and the control is preset to generate a fixed low biasing current during the light-off pulses. Even though the current source 404 is not simplified, the current control process is straightforward and involves no data refreshing.

Figure 5B:
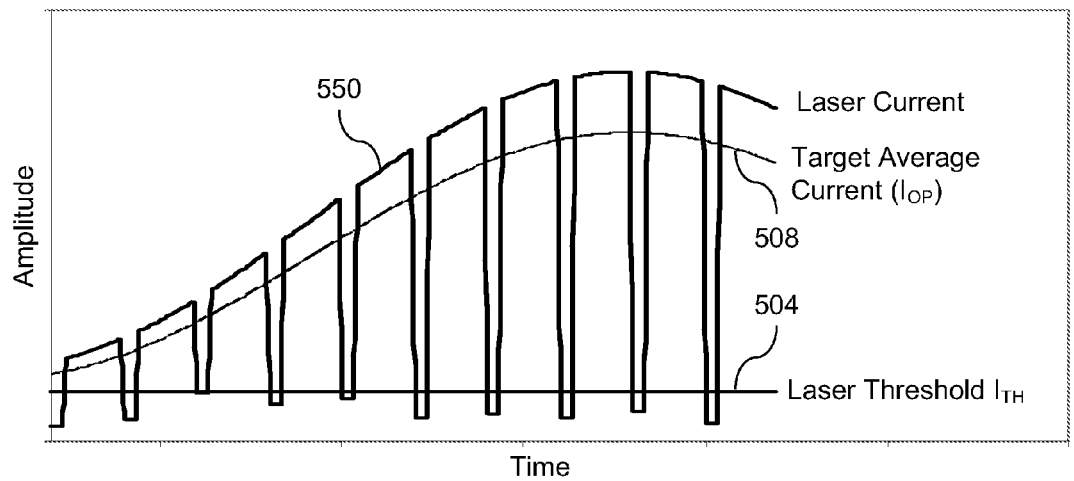
FIG. 5B illustrates another exemplary pulsed laser current waveform according to various embodiments of the invention.

FIG. 5B illustrates another exemplary pulsed laser current waveform 550 generated by certain embodiments of the pulse-off laser driver. The high-end modulation current $I_{MOD}$ varies with time, and during the pulse-off duration, the low-end biasing current $I_{BIAS}$ is controlled at a randomly-varying value equal to or slightly less than the laser threshold current $I_{TH}$ 504. This embodiment requires that the current source 404 is capable of generating a variable biasing current $I_{BIAS}$ and the biasing current level has to be adjusted for each light-off pulses.

In both FIG. 5A and FIG. 5B, the perceived laser intensity is related to the target average current 506 and 508 integrated over the eye's sampling/integration time. If the duration of the light-off pulses is controlled to be short, the duty cycle of the laser current may be significantly larger than 50%, and the target average current may be very close to the high-end modulation current $I_{MOD}$. For instance, if the duty cycle is 90%, the transient modulation current $I_{MOD}$ is 1.05 times of the target average current. In the prior art using RF modulation, the equivalent duty cycle is only 50%, so the modulation current can reach twice of the target average current. As a result, the pulse-off speckle reduction technique lowers down the peak current in the laser diode, relaxes the current requirements from the current source 402, and therefore, enhances cost efficiency and power consumption for the driver electronics.

In the embodiments of FIG. 5A and FIG. 5B, the target average currents 506 and 508 are mainly determined by the levels of the modulation currents $I_{MOD}$. The duty cycle is adjustable, and however, its contribution is not as significant as the modulation currents $I_{MOD}$. Therefore, the current source 402 is required to maintain the capability of adjusting the modulation current $I_{MOD}$ in real time.

Figure 6:
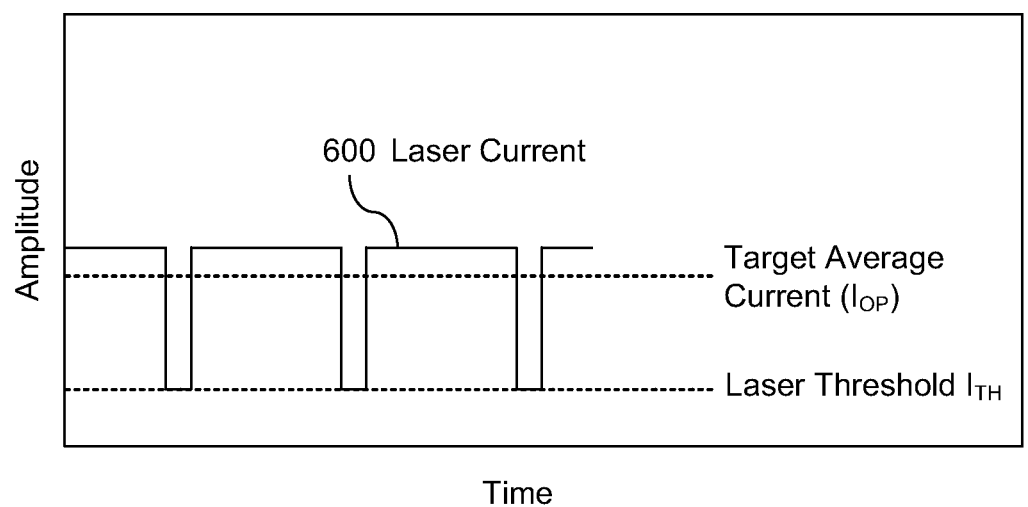
FIG. 6 illustrates a digital pulsed laser current waveform according to various embodiments of the invention.

FIG. 6 illustrates a digital pulsed laser current waveform. The high-end modulation current $I_{MOD}$ is fixed at a value, and during the pulse-off duration, the low-end biasing current $I_{BIAS}$ is also fixed at another value equal to or slightly less than the laser threshold current $I_{TH}$. The current sources 402 and 404 only need to generate one specific current or a limited number of currents, so the complexity may be significantly reduced by avoiding covering the entire dynamic range at a 12b resolution. In certain embodiment, the target average current is obtained by adjusting the duty cycle. Given the modulation current $I_{MOD}$, the duty cycle is proportional to the target average current. The maximum target average current will never exceed the modulation current $I_{MOD}$ while the minimum target average current will be higher than the low-end biasing current $I_{BIAS}$.

The duty cycles are adjusted in the controller 412 and should be controlled accurately up to a system clock. If the system clock is 100 MHz, and 16 phases are made available, the accuracy of the pulse width is 0.625 nanoseconds. Given a pulse-off frequency of 100 MHz, the duty cycle is controlled within 625 ppm and associated with an average current resolution up to 4 bits. The duty cycle control is based on digital circuit and may be much easier to implement.

Compared to RF modulation, control is largely simplified in the pulse-off speckling reduction. One more variable, duty cycle, is introduced to efficiently obtain the target average current. The analog control of the laser current is reduced by integrating more digital control of duty cycles. In certain embodiment, the modulation current and the biasing currents are both fixed, and the target average current is adjusted only by duty cycles. One skilled in the art will recognize that FIG. 5A, FIG. 5B and FIG. 6 are intended as three embodiments of using pulse-off speckling reduction, and that the circuit structure is open for implementing other modifications, equivalents, and alternatives.

While the invention is susceptible to various modifications and alternative forms, specific examples thereof have been shown in the drawings and are herein described in detail. It should be understood, however, that the invention is not to be limited to the particular forms disclosed, but to the contrary, the invention is to cover all modifications, equivalents, and alternatives falling within the scope of the present invention.

What is claimed is:

1. A laser driver that drives a laser diode with a pulsed modulation current, comprising:
    a controller that is coupled to receive and process video data;
    a pulse-off control module, coupled to the controller, the pulse-off control module controls at least a first analog switch and a second analog switch;
    a first current source, coupled in series with the first analog switch that is regularly switched off within one integration period of human eyes, the first current source generating a modulation current that is greater than a laser threshold current, such that the modulation current causes the laser diode to emit light; and a second current source coupled in series with the second analog switch, the second current source receives light-off pulses from the pulse-off control module that are shorter than one integration period of human eyes to generate a pulsed biasing current that causes the laser diode to emit no light during the light-off pulses when the second analog switch is closed thereby generating a plurality of laser waves that are incoherent to each other.

2. The laser driver in claim 1, wherein the first current source is coupled to the controller and the magnitude of the modulation current is adjusted according to the video data.

3. The laser driver in claim 1, wherein the modulation current has a fixed magnitude, and the duty cycle of the modulation current is adjusted by the first analog switch according to the video data.

4. The laser driver in claim 1, wherein the first current source further comprises a digital to analog converter.

5. The laser driver in claim 1, wherein the pulse-off control module controls the first and second analog switch based on the video data.

6. The laser driver in claim 1, wherein the biasing current is substantially small to shut off light emission from the laser diode, while avoiding a drive current passing through the laser diode to drop to zero and causing long-term degradation to the laser diode.

7. The laser driver in claim 1, wherein the biasing current is controlled at a randomly varying value equal to or slightly less than the value of the laser threshold current.

8. The laser driver in claim 1, wherein the biasing current is controlled at a constant value equal to or slightly less than the value of the laser threshold current.

9. A laser driver that drives a laser diode with a pulsed modulation current, comprising:

a controller that is coupled to receive and process video data;

a pulse-off control module, coupled to the controller, the pulse-off control module controls at least a first analog switch that is regularly switched off within one integration period of human eyes and a second analog switch;

a first current source, coupled in series with the first analog switch, the first current source generating a modulation current that is greater than a threshold current; and a second current source, coupled in series with the second analog switch, the second current source receives light-off pulse signals from the pulse-off control module that are shorter than one integration period of human eyes to generate a pulsed biasing current that when the second analog switch is closed causes the laser diode to emit no light so as to reduce a coherence of a plurality of laser waves, wherein the controller is directly connected to at least one of the first current source and the second current source.

10. The laser driver in claim 9, wherein the pulse-off control module controls the first and second analog switch based on the video data.

11. The laser driver in claim 9, wherein both the modulation current and the biasing current have a respective fixed magnitude, and the duty cycle of the pulsed modulation current is adjusted by the first analog switch according to the video data.

12. The laser driver in claim 9, wherein the first and second current sources further comprise a respective digital to analog converters.

13. A laser driving method, comprising steps of:

receiving input video data;

regularly switching off, within one integration period of human eyes, a first analog switch with a first current source to generate a modulation current according to the input video data, the modulation current being above a laser threshold current;

controlling a second current source via a light-off pulse signal that is shorter than one integration period of human eyes;

disabling the modulation current during the light-off pulse signal;

generating a biasing current that is equal to or slightly less than the laser threshold current during the light-off pulse signal; and reducing a coherence of a plurality of laser waves.

14. The laser driving method in claim 13, wherein the modulation current has a fixed magnitude, and the widths of the light-off pulses are adjusted according to the input video data.

15. The laser driving method in claim 13, wherein a digital to analog converter is coupled to generate the modulation current according to the input video data.

16. The laser driving method in claim 13, wherein the biasing current is controlled at a randomly varying value equal to or slightly less than the value of the laser threshold current.

17. The laser driving method in claim 13, wherein the biasing current is controlled at a constant value.

* * * * *